(12) United States Patent  (10) Patent No.: US 9,153,305 B2
Manning  (45) Date of Patent: Oct. 6, 2015

(54) INDEPENDENTLY ADDRESSABLE MEMORY ARRAY ADDRESS SPACES

(71) Applicant: Micron Technology, Inc., Boise, ID (US)

(72) Inventor: Troy A. Manning, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/015,732

(22) Filed: Aug. 30, 2013

(65) Prior Publication Data

US 2015/0063052 A1   Mar. 5, 2015

(51) Int. Cl.
  *G11C 8/00* (2006.01)
  *G11C 8/10* (2006.01)

(52) U.S. Cl.
  CPC .................................. *G11C 8/10* (2013.01)

(58) Field of Classification Search
  USPC ............................................. 365/205, 230.03
  See application file for complete search history.

(56) References Cited

U.S. PATENT DOCUMENTS

| | | | |
|---|---|---|---|
| 4,380,046 A | 4/1983 | Fung | |
| 4,435,793 A * | 3/1984 | Ochii | 365/233.1 |
| 4,843,264 A | 6/1989 | Galbraith | |
| 4,977,542 A * | 12/1990 | Matsuda et al. | 365/207 |
| 5,023,838 A | 6/1991 | Herbert | |
| 5,034,636 A | 7/1991 | Reis et al. | |
| 5,201,039 A | 4/1993 | Sakamura | |
| 5,210,850 A | 5/1993 | Kelly et al. | |
| 5,253,308 A | 10/1993 | Johnson | |
| 5,481,500 A | 1/1996 | Reohr et al. | |
| 5,615,404 A | 3/1997 | Knoll et al. | |
| 5,678,021 A | 10/1997 | Pawate et al. | |
| 5,751,987 A | 5/1998 | Mahant-Shetti et al. | |
| 5,870,504 A | 2/1999 | Nemoto et al. | |
| 5,991,209 A | 11/1999 | Chow | |
| 6,301,164 B1 | 10/2001 | Manning et al. | |
| 6,466,499 B1 | 10/2002 | Blodgett | |
| 6,754,746 B1 | 6/2004 | Leung et al. | |
| 6,894,549 B2 | 5/2005 | Eliason | |
| 6,950,898 B2 | 9/2005 | Merritt et al. | |
| 7,045,834 B2 | 5/2006 | Tran et al. | |
| 7,054,178 B1 | 5/2006 | Shiah et al. | |

(Continued)

FOREIGN PATENT DOCUMENTS

WO   2013062596 A1   5/2013

OTHER PUBLICATIONS

Dybdahl, et al., "Destructive-Read in Embedded DRAM, Impact on Power Consumption," Apr. 2006, (10 pgs.), vol. 2, Issue 2, Journal of Embedded Computing-Issues in embedded single-chip multicore architectures.

(Continued)

*Primary Examiner* — Hoai V Ho
(74) *Attorney, Agent, or Firm* — Brooks, Cameron & Huebsch, PLLC

(57) ABSTRACT

Examples of the present disclosure provide devices and methods for accessing a memory array address space. An example memory array comprising a first address space comprising memory cells coupled to a first number of select lines and to a number of sense lines and a second address space comprising memory cells coupled to a second number of select lines and to the number of sense lines. The first address space is independently addressable relative to the second address space.

27 Claims, 3 Drawing Sheets

(56) References Cited

U.S. PATENT DOCUMENTS

| | | |
|---|---|---|
| 7,260,672 B2 | 8/2007 | Garney |
| 7,372,715 B2 | 5/2008 | Han |
| 7,546,438 B2 | 6/2009 | Chung |
| 7,663,928 B2 | 2/2010 | Tsai et al. |
| 7,692,466 B2 | 4/2010 | Ahmadi |
| 8,042,082 B2 | 10/2011 | Solomon |
| 8,279,683 B2 | 10/2012 | Klein |
| 2001/0010057 A1 | 7/2001 | Yamada |
| 2003/0222879 A1 | 12/2003 | Lin et al. |
| 2011/0093662 A1 | 4/2011 | Walker et al. |
| 2011/0119467 A1 | 5/2011 | Cadambi et al. |
| 2012/0246380 A1 | 9/2012 | Akerib et al. |
| 2013/0003467 A1 | 1/2013 | Klein |
| 2014/0185395 A1* | 7/2014 | Seo .......................... 365/189.17 |

OTHER PUBLICATIONS

Kogge, et al, "Processing in Memory: Chips to Petaflops," May 23, 1997, (8 pgs.), retrieved from: http://www.cs.ucf.edu/courses/cda5106/summer02/papers/kogge97PIM.pdf.

Draper, et al, "The Architecture of the DIVA Processing-In-Memory Chip," Jun. 22-26, 2002, (12 pgs.), ICS '02, retrieved from: http://www.isi.edu/~draper/papers/ics02.pdf.

Adibi, et al., "Processing-In-Memory Technology for Knowledge Discovery Algorithms," Jun. 25, 2006, (10 pgs.), Proceeding of the Second International Workshop on Data Management on New Hardware, retrieved from: http://www.cs.cmu.edu/~damon2006/pdf/adibi06inmemory.pdf.

U.S. Appl. No. 13/449,082, entitled, "Methods and Apparatus for Pattern Matching," filed Apr. 17, 2012 (37 pgs.).

U.S. Appl. No. 13/743,686, entitled, "Weighted Search and Compare in a Memory Device," filed Jan. 17, 2013, (25 pgs.).

U.S. Appl. No. 13/774,636, entitled, "Memory as a programmable Logic Device," filed Feb. 22, 2013, (30 pgs.).

U.S. Appl. No. 13/774,553, entitled, "Neural Network in a Memory Device," filed Feb. 22, 2013, (63 pgs.).

U.S. Appl. No. 13/796,189, entitled, "Performing Complex Arithmetic Functions in a Memory Device," filed Mar. 12, 2013, (23 pgs.).

International Search Report and Written Opinion for related PCT Patent Application No. PCT/US2014/050816, dated Nov. 21, 2014, 10 pages.

* cited by examiner

INDEPENDENTLY ADDRESSABLE MEMORY ARRAY ADDRESS SPACES

TECHNICAL FIELD

The present disclosure relates generally to semiconductor memory apparatuses and methods, and more particularly, to apparatuses and methods related to independently addressable memory array address spaces.

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Electronic systems often include a number of processing resources (e.g., one or more processors), which may retrieve and execute instructions and store the results of the executed instructions to a suitable location. A processor can comprise a number of functional units such as arithmetic logic unit (ALU) circuitry, floating point unit (FPU) circuitry, and/or a combinatorial logic block, for example, which can be used to execute instructions by performing logical operations such as AND, OR, NOT, NAND, NOR, and XOR logical operations on data (e.g., one or more operands). For example, the functional unit circuitry (FUC) may be used to perform arithmetic operations such as addition, subtraction, multiplication, and/or division on operands.

A number of components in an electronic system may be involved in providing instructions to the FUC for execution. The instructions may be generated, for instance, by a processing resource such as a controller and/or host processor. Data (e.g., the operands on which the instructions will be executed) may be stored in a memory array that is accessible by the FUC. The instructions and/or data may be retrieved from the memory array and sequenced and/or buffered before the FUC begins to execute instructions on the data. Furthermore, as different types of operations may be executed in one or multiple clock cycles through the FUC, intermediate results of the instructions and/or data may also be sequenced and/or buffered.

In many instances, the processing resources (e.g., processor and/or associated FUC) may be external to the memory array, and data can be accessed via a bus between the processing resources and the memory array (e.g., to execute instructions). Data can be moved from the memory array to registers external to the memory array via a bus.

DETAILED DESCRIPTION

Figure 1:
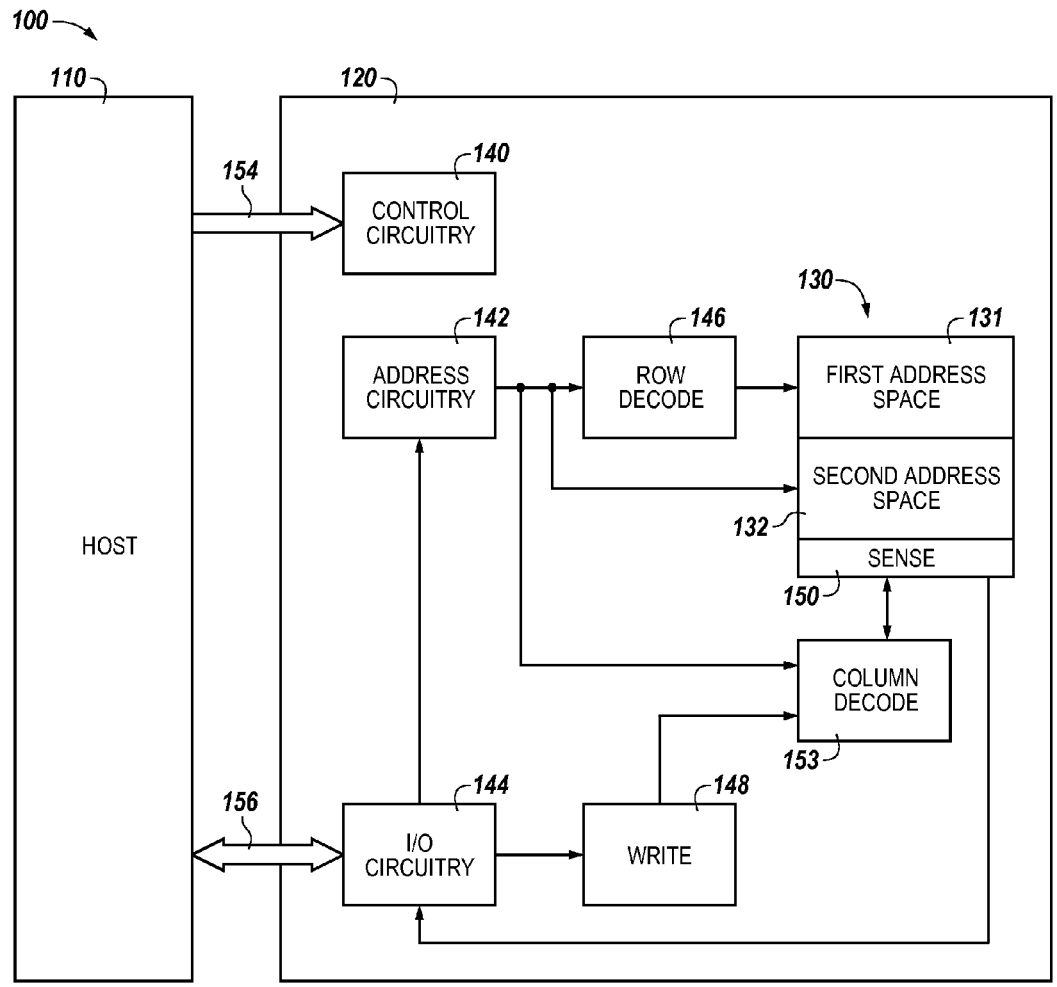
FIG. 1 is a block diagram of an apparatus in the form of a computing system including a memory device in accordance with a number of embodiments of the present disclosure.

The present disclosure includes apparatuses and methods related to accessing a memory array address space. An example memory array comprises a first address space comprising memory cells coupled to a first number of select lines and to a number of sense lines and a second address space comprising memory cells coupled to a second number of select lines and to the number of sense lines. The first address space is independently addressable relative to the second address space.

A number of embodiments of the present disclosure can provide a reduction of the number of registers external to a memory array that are used to store intermediate results during the execution of a logical operation. Parallelism and/or reduced power consumption can be improved in association with accessing registers when a processing resource is coupled (e.g., integrated) with the memory array cells as compared to registers that are accessed by processing resources such as previous PIM systems and systems having an external processor (e.g., a processing resource located external from a memory array, such as on a separate integrated circuit chip). For instance, a number of embodiments can provide for performing fully complete compute functions such as integer add, subtract, multiply, divide, and CAM (content addressable memory) functions using data from a number of registers without transferring data out of the memory array and sensing circuitry via a bus (e.g., data bus, address bus, control bus). Such compute functions can involve performing a number of logical operations (e.g., AND, NOT, NOR, NAND, XOR, etc.). However, embodiments are not limited to these examples. In a number of embodiments, rows of memory cells within the array can serve as registers in association with performing compute functions. The rows of memory cells serving as registers can be part of an address space that is independently addressable relative to an address space that includes other rows of memory cells, for example.

In previous approaches, data may be transferred from the array and sensing circuitry (e.g., via a bus comprising input/output (I/O) lines) to a number of registers that can be used by a processing resource such as a processor, microprocessor, and/or compute engine, which may comprise ALU circuitry and/or other functional unit circuitry configured to perform the appropriate logical operations. However, transferring data to/from memory from/to registers via a bus can involve significant power consumption and time requirements. Even if the processing resource is located on a same chip as the memory array, significant power can be consumed in moving data out of the array to the compute circuitry, which can involve performing a sense line address access (e.g., firing of a column decode signal) in order to transfer data from sense lines onto I/O lines, moving the data to the array periphery, and providing the data to a register in association with a compute function, for instance.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designator "N," particularly with respect to reference numerals in the drawings, indicates that a number of the particular feature so designated can be included. As used herein, "a number of" a particular thing can refer to one or more of such things (e.g., a number of memory arrays can refer to one or more memory arrays).

The figures herein follow a numbering convention in which the first digit or digits correspond to the drawing figure number and the remaining digits identify an element or component in the drawing. Similar elements or components between different figures may be identified by the use of similar digits. For example, 130 may reference element "30" in FIG. 1, and a similar element may be referenced as 230 in FIG. 2. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention, and should not be taken in a limiting sense FIG. 1 is a block diagram of an apparatus in the form of a computing system 100 including a memory device 120 in accordance with a number of embodiments of the present disclosure. As used herein, a memory device 120, a memory array 130, and/or sensing circuitry 150 might also be separately considered an "apparatus."

System 100 includes a host 110 coupled to memory device 120, which includes a memory array 130. Host 110 can be a host system such as a personal laptop computer, a desktop computer, a digital camera, a mobile telephone, or a memory card reader, among various other types of hosts. Host 110 can include a system motherboard and/or backplane and can include a number of processing resources (e.g., one or more processors, microprocessors, or some other type of controlling circuitry). The system 100 can include separate integrated circuits or both the host 110 and the memory device 120 can be on the same integrated circuit. The system 100 can be, for instance, a server system and/or a high performance computing (HPC) system and/or a portion thereof. Although the example shown in FIG. 1 illustrates a system having a Von Neumann architecture, embodiments of the present disclosure can be implemented in non-Von Neumann architectures (e.g., a Turing machine), which may not include one or more components (e.g., CPU, ALU, etc.) often associated with a Von Neumann architecture.

For clarity, the system 100 has been simplified to focus on features with particular relevance to the present disclosure. The memory array 130 can be a DRAM array, SRAM array, STT RAM array, PCRAM array, TRAM array, RRAM array, NAND flash array, and/or NOR flash array, for instance. The array 130 can comprise memory cells arranged in rows coupled by select lines (which may be referred to herein as word lines or access lines) and columns coupled by sense lines (which may be referred to herein as digit lines or data lines). Although a single array 130 is shown in FIG. 1, embodiments are not so limited. For instance, memory device 120 may include a number of arrays 130 (e.g., a number of banks of DRAM cells). An example DRAM array is described in association with FIG. 2.

The memory device 120 includes address circuitry 142 to latch address signals provided over an I/O bus 156 (e.g., a data bus) through I/O circuitry 144. Address signals are received and decoded by a row decoder 146 and a column decoder 153 to access the memory array 130. In a number of examples, address signals can be decoded by more or fewer row decoders. For example, memory device can include three row decoders. As used herein, a row decoder may be referred to as a select decoder. In a number of examples, a row decoder 146 may be used to decode an address space 131 corresponding to memory cells in memory array 130. In FIG. 1, address space 132 can be independently addressed relative to address space. Data can be read from memory array 130 by sensing voltage and/or current changes on the sense lines using sensing circuitry 150. The sensing circuitry 150 can read and latch a page (e.g., row) of data from the memory array 130. The I/O circuitry 144 can be used for bi-directional data communication with host 110 over the I/O bus 156. The write circuitry 148 is used to write data to the memory array 130.

In a number of embodiments, row decoder 146 can receive a first number of bits through a first number of lines from the address circuitry 142. The first number of bits can be pre-decoded to fire a second number of lines, e.g., pre-decoded lines, within the row decoder 146. The second number of lines can be coupled to a number of final-decoders within row decoder 146. Each of the final-decoders can connect to a unique combination of the pre-decoded lines. Each of the final-decoders can be used to activate the rows of address space 131. As such, the rows of address space 331 are decoded via shared address lines. For example, an eight bit address can be received through eight lines from the address circuitry 142 at the row decoder 146. The eight bits can be pre-decoded to activate twenty pre-decoded lines. Each of the final decoders can connect to a unique combination of the twenty pre-decoded lines to activate any of 256 (e.g., 28) rows. The number of decodings performed between receiving a number of bits at the row decoder 146 and activating the number of rows can be more or less than those shown in the above examples. For example, there can be more and/or less than a pre-decoding and a final-decoding associated with row decoder 146.

In a number of examples, the term decoding can include a pre-decoding, final-decoding, and/or any other type of decoding that is carried out in row decoder 146 and/or column decoder 153. In a number of examples the term pre-decoding include circuitry implementing pre-decoding process such that addresses are not discretely addressed. The term pre-decoding and decoding can be used herein to differentiate between the terms discretely addressable lines, and/or individually addressable lines.

In a number of examples, the rows associated with address space 132 are individually addressed and/or decoded independently from the other rows of memory array 130. As used herein, a discrete address can be an address that does not require decoding in order to activate a particular select line. For example, address circuitry 142 can receive an address associated with address space 132 and can activate a select line without decoding the address. In a number of examples, individually addressed rows and/or discretely addresses rows can be referred to as fully decoded rows. The memory cells associated with address space 131 and memory cells associated with address space 132 can comprise memory cells otherwise used in DRAM arrays, SRAM arrays, STT RAM arrays, PCRAM arrays, TRAM arrays, RRAM arrays, NAND flash arrays, and/or NOR flash arrays, among other memory configurations, for instance. Other differences between address space 131 and address space 132 will be expanded upon in association with FIG. 2 and FIG. 3.

Control circuitry 140 decodes signals provided by control bus 154 from the host 110. These signals can include chip enable signals, write enable signals, and address latch signals that are used to control operations performed on the memory array 130, including data read, data write, and data erase operations. In various embodiments, the control circuitry 140 is responsible for executing instructions from the host 110. The control circuitry 140 can be a state machine, a sequencer, or some other type of controller.

An example of the sensing circuitry 150 is described further below in association with FIG. 3. For instance, in a number of embodiments, the sensing circuitry 150 can comprise a number of sense amplifiers and a number of compute components, which may comprise an accumulator (e.g., compute component 333 shown in FIG. 3) and can be used to perform logical operations (e.g., on data associated with complementary sense lines). In a number of embodiments, the sensing circuitry (e.g., 150) can be used to perform logical operations using data stored in array 130 as inputs and store the results of the logical operations back to the array 130 without transferring via a sense line address access (e.g., without firing a column decode signal). The rows corresponding to address space 132 can serve as temporary storage (e.g., registers) during the performance of logical operations and/or compute functions. As such, various compute functions can be performed using sensing circuitry 150 rather than and/or in addition to being performed by processing resources external to the sensing circuitry (e.g., by a processor associated with host 110 and/or other processing circuitry, such as ALU circuitry, located on device 120 (e.g., on control circuitry 140 or elsewhere)).

In various previous approaches, data associated with an operand, for instance, would be read from memory via sensing circuitry and provided to an external ALU. The external ALU circuitry would perform compute functions using the operands and the result could be transferred back to the array via the local I/O lines. In contrast, in a number of embodiments of the present disclosure, sensing circuitry (e.g., 150) is configured to perform logical operations on data stored in memory cells associated with address space 131 and memory cells associated with address space 132 and store the result back to the array 130 without enabling a local I/O line coupled to the sensing circuitry.

As such, in a number of embodiments, registers external to array 130 and sensing circuitry 150 may not be needed to perform compute functions as the sensing circuitry 150 can perform the appropriate logical operations using the address spaces 131 and 132 of array 130. Additionally, such compute functions can be performed without the use of an external processing resource. Therefore, address space 132 may be used to compliment and/or to replace, at least to some extent, a number of such external registers. However, in a number of embodiments, address space 132 of array 130 may be used in conjunction with a number of registers external to array 130 and/or external to memory device 120.

Figure 2:
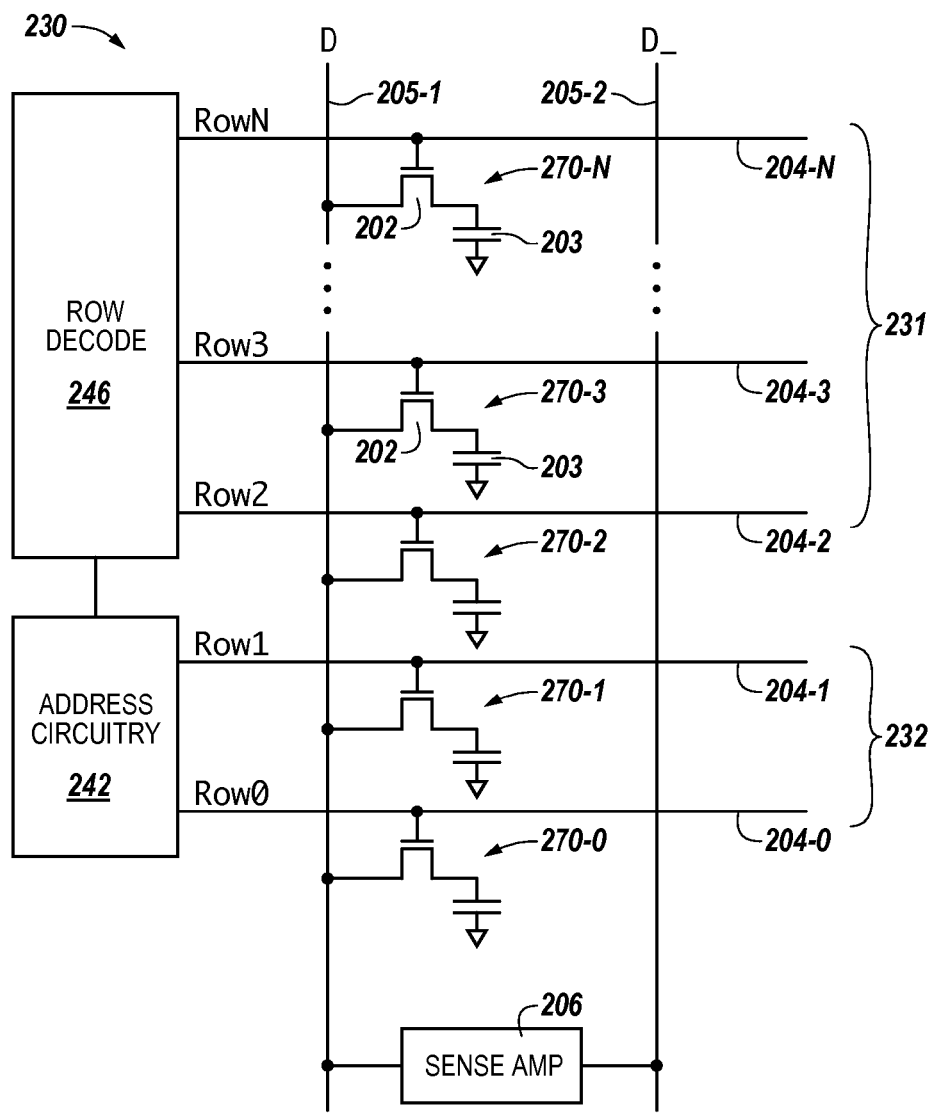
FIG. 2 illustrates a schematic diagram of a portion of a memory array in accordance with a number of embodiments of the present disclosure.

FIG. 2 illustrates a schematic diagram of a portion of a memory array 230 in accordance with a number of embodiments of the present disclosure. In this example, the memory array 230 is a DRAM array of 1T1C (one transistor one capacitor) memory cells 270-0, 270-1, 270-2, 270-3, . . . , 270-N (e.g., referred to collectively as memory cells 270) each comprised of an access device 202 (e.g., transistor) and a storage element 203 (e.g., a capacitor).

In a number of embodiments, the memory cells 270 are destructive read memory cells (e.g., reading the data stored in the cell destroys the data such that the data originally stored in the cell is refreshed after being read). The memory cells 270 are arranged in rows coupled by select lines 204-0 (Row0), 204-1 (Row1), 204-2 (Row2), 204-3 (Row3), . . . , 204-N (RowN) and columns coupled by sense lines (e.g., digit lines) 205-1 (D) and 205-2 (D_). In a number of embodiments, the array 230 can include address spaces that are coupled to separate circuitry. For example, as shown in FIG. 2, the select lines 204-2, 204-3, . . . , 204-N of address space 231 are coupled to select decoder 246 and the select lines 204-0 and 204-1 of address space 232 are coupled to address circuitry 242. In a number of examples, at least one of the select lines 204-0 and 204-1 of address space 232 can be coupled to a select decoder that is independent of select decoder 246.

In this example, each column of cells is associated with a pair of complementary sense lines 205-1 (D) and 205-2 (D_). Although only a single column of memory cells 270 is illustrated in FIG. 2, embodiments are not so limited. For instance, a particular array may have a number of columns of cells and/or sense lines (e.g., 4,096, 8,192, 16,384, etc.). In FIG. 2, memory cells 270 are coupled to sense line 205-1. A gate of a particular cell transistor 202 is coupled to its corresponding select line 204-0 to 204-N (e.g., referred to collectively as select lines 204), a first source/drain region is coupled to its corresponding sense line 205-1, and a second source/drain region of a particular cell transistor is coupled to its corresponding capacitor 203. Although not illustrated in FIG. 2, the sense line 205-2 may also have memory cells coupled thereto.

In FIG. 2, the select lines 204-2 to 204-N of address space 231 are decoded via a number of shared address lines. As such, the select lines 204-2 to 204-N are activated via pre-decoding associated with row decoder circuitry (e.g., row decoder 246). In a number of embodiments, due to the pre-decode process, only one of the select lines 204-2 to 204-N can be activated at any given time due to the pre-decoding constraints. The select lines 204-0 and 204-1 of address space 232 are coupled directly to the address circuitry 242 and can be activated discreetly by the address circuitry 242 (e.g., without decoding an address). As such, the select lines 204-0 and 204-1 can be activated simultaneously and may be activated simultaneously along with one of the pre-decoded select lines 204-2 to 204-N.

In a number of embodiments, the select lines 204-2 to 204-N are independently addressable relative to the select lines 204-0 and 204-1 since the select lines 204-2 to 204-N are coupled to row decoder 246 and the select lines 204-0 and 204-1 are coupled directly to address circuitry 242 and/or since the select lines 204-2 to 204-N are coupled to a number of shared address lines via row decoder 246 and the select lines 204-o and 204-1 are discreetly addressable. In a number of embodiments, a first address space (e.g., an address space corresponding to select lines 204-0 and 204-1) is independently addressable relative to a second address space (e.g., an address space corresponding to select lines 204-2 to 204-N) since the number of select lines corresponding to the first address space are coupled to a first decoder and the number of select lines corresponding to the second address space are coupled to a second decoder.

In a number of embodiments, because the first address space and the second address space are independently addressable, select lines of the first and second address space can be activated simultaneously. In a number of embodiments in which an address space is coupled to shared address lines, only one of the select lines may be activated at a given time. However, in such embodiments, a select line of the address space coupled to shared address lines may be activated simultaneously with one or more select lines corresponding to another address space.

In a number of examples, the memory cells coupled to select lines corresponding to address space 232 can be used as registers. That is, the memory cells coupled to respective rows of address space 232 can serve as temporary storage in association with performing logical operations, for instance. As an example, memory cells 270-0 and 270-1 can be used as temporary storage that can be activated by a compute component that is coupled to the sense amplifier 206 to perform logic operations. Examples of the use of memory cells as registers are described further in association with FIG. 3.

Decoder 246 can receive an address (e.g., from address circuitry 242) that corresponds to a particular select line of decoder 246 as input. The decoder 246 can, via a pre-decode process, decode the address and activate appropriate shared address lines in order to activate the particular select line of address space 231 (e.g., select lines 204-2 to 204-N). In this example, decoder 246 decodes addresses for select lines 204-2 to 204-N. In a number of examples, more or fewer decoders can be used to decode addresses associated with address space 231.

In a number of examples, decoder 246 can be independent from a decoder used to activate select lines of address space 232. In a number of embodiments, a host may have access to address space 231 and may not have access to address space 232. For example, a host may be able to directly access the memory cells 270-2 to 270-N coupled to select lines 204-2 to 204-N of address space 231, but may not be able to access the memory cells 270-0 and 270-1 coupled to select lines 204-0 and 204-1 of address space 232.

In a number of embodiments, and as illustrated in FIG. 2, the memory cells of address space 232 are located on a pitch with the memory cells of address space 231. In FIG. 2, the select lines of address space 232 are located at an edge portion (e.g., on the fringe) of the memory array 230, however, embodiments are not so limited. In a number of embodiments, the select lines corresponding to address space 232 and/or address space 231 may not be grouped together as consecutive numbers of select lines. For instance, a number of select lines of address space 231 may include a number of select lines of address space 232 positioned there between.

In a number of embodiments, the address space 231 and the address space 232 can be associated with a first and second block of addresses, respectively. Each block of addresses can comprise a number of addresses, for instance. Consecutive addresses can refer to addresses that numerically increase by a single address from a first address to a last address. An address block can include all of the addresses between a first address and a last address of the block of addresses. A block of addresses can be divided into a number of sub-blocks of addresses. For example, the memory array 230 can be associated with a block of addresses which can include a first sub-block of addresses associated with address space 231 and a second sub-block of addresses associated with the address space 232.

A host may have a limited ability to directly access addresses associated with the address space 232 (e.g., the address space 232 may not be accessible by a user). Limited access to a particular address space (or portion thereof) can be used, for instance, to reserve the use of the particular address space. For example, an address associated with address space 232 can be reserved for use with computing operations as described further in connection with FIG. 3. In a number of embodiments, a host that is not aware of an address can have limited access to the address. In a number embodiments, a host may have direct access to address space 231 and address space 232. In a number of embodiments, a host may have direct access to address space 231 and/or to a portion of address space 232. For example, a host can have direct access to memory cell 270-1 and row 204-1 and not have direct access to memory cell 270-0 and row 204-0. In a number of examples, a host may have direct access to address space 231 and not have direct access to address space 232.

Figure 3:
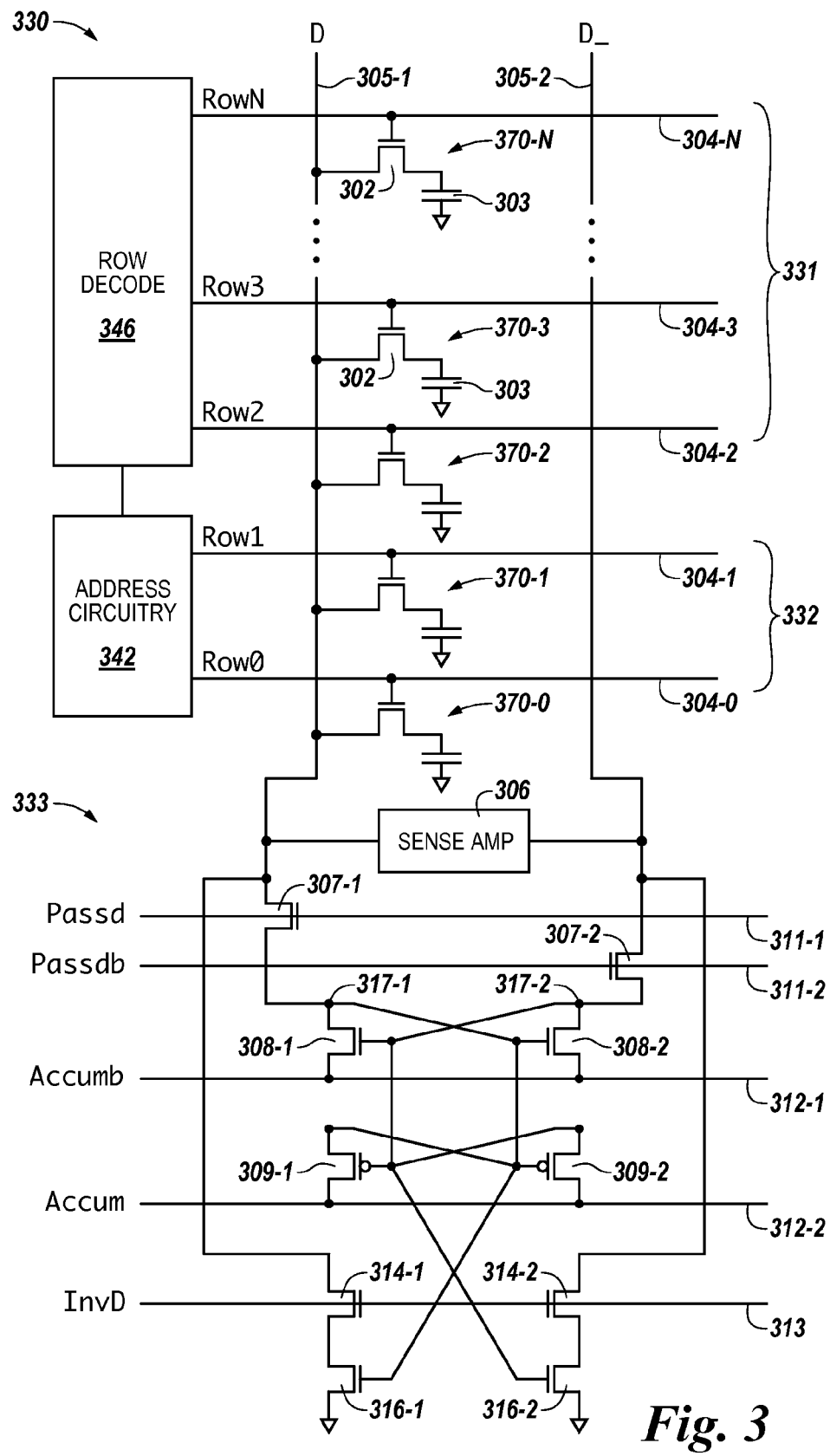
FIG. 3 illustrates a schematic diagram of a portion of a memory array coupled to sensing circuitry in accordance with a number of embodiments of the present disclosure.

FIG. 3 illustrates a schematic diagram of a portion of a memory array 330 coupled to sensing circuitry in accordance with a number of embodiments of the present disclosure. FIG. 3 includes memory array 330 that is analogous to memory array 230 in FIG. 2.

In this example, the sensing circuitry comprises a sense amplifier 306 and a compute component 333. The sensing circuitry can be sensing circuitry 150 shown in FIG. 1. The sense amplifier 306 is coupled to the complementary sense lines D, D_ corresponding to a particular column of memory cells. The sense amplifier 306 can be operated to determine a state (e.g., logic data value) stored in a selected cell (e.g., memory cells 370). Embodiments are not limited to the example sense amplifier 306. For instance, sensing circuitry in accordance with a number of embodiments described herein can include current-mode sense amplifiers and/or single-ended sense amplifiers (e.g., sense amplifiers coupled to one sense line).

In a number of embodiments, a compute component (e.g., 333) can comprise a number of transistors formed on pitch with the transistors of the sense amplifier (e.g., 306) and/or the memory cells 370 of the array (e.g., 330), which may conform to a particular feature size (e.g., $4F^2$, $6F^2$, etc.). As described further below, the compute component 333 can, in conjunction with the sense amplifier 306, operate to perform various logical operations using data from the memory cells 370 in the array 330 as input and store the result back to the memory cells 370 in the array 330 without transferring the data via a sense line address access (e.g., without firing a column decode signal such that data is transferred to circuitry external from the array and sensing circuitry via local I/O lines). As such, a number of embodiments of the present disclosure can enable performing logical operations and computing functions associated therewith using less power than various previous approaches. Additionally, since a number of embodiments eliminate the need to transfer data across local I/O lines in order to perform compute functions, a number of embodiments can enable an increased parallel processing capability using a compute components (e.g., 333) and the memory cells 370 as compared to previous approaches.

In the example illustrated in FIG. 3, the circuitry corresponding to compute component 333 comprises five transistors coupled to each of the sense lines D and D_; however, embodiments are not limited to this example. Transistors 307-1 and 307-2 have a first source/drain region coupled to sense lines D and D_, respectively, and a second source/drain region coupled to a cross coupled latch (e.g., coupled to gates of a pair of cross coupled transistors, such as cross coupled NMOS transistors 308-1 and 308-2 and cross coupled PMOS transistors 309-1 and 309-2. As described further herein, the cross coupled latch comprising transistors 308-1, 308-2, 309-1, and 309-2 can be referred to as a secondary latch (the cross coupled latch corresponding to sense amplifier 306 can be referred to herein as a primary latch).

The transistors 307-1 and 307-2 can be referred to as pass transistors, which can be enabled via respective signals 311-1 (Passd) and 311-2 (Passdb) in order to pass the voltages or currents on the respective sense lines D and D_ to the inputs of the cross coupled latch comprising transistors 308-1, 308-2, 309-1, and 309-2 (e.g., the input of the secondary latch). In this example, the second source/drain region of transistor 307-1 is coupled to a first source/drain region of transistors 308-1 and 309-1 as well as to the gates of transistors 308-2 and 309-2. Similarly, the second source/drain region of transistor 307-2 is coupled to a first source/drain region of transistors 308-2 and 309-2 as well as to the gates of transistors 308-1 and 309-1.

A second source/drain region of transistor 308-1 and 308-2 is commonly coupled to a negative control signal 312-1 (Accumb). A second source/drain region of transistors 309-1 and 309-2 is commonly coupled to a positive control signal 312-2 (Accum). The Accum signal 312-2 can be a supply voltage (e.g., Vcc) and the Accumb signal can be a reference voltage (e.g., ground). Enabling signals 312-1 and 312-2 activates the cross coupled latch comprising transistors 308-1, 308-2, 309-1, and 309-2 corresponding to the secondary latch. The activated sense amplifier pair operates to amplify a differential voltage between common node 317-1 and common node 317-2 such that node 317-1 is driven to one of the Accum signal voltage and the Accumb signal voltage (e.g., to one of Vcc and ground), and node 317-2 is driven to the other of the Accum signal voltage and the Accumb signal voltage. As described further below, the signals 312-1 and 312-2 are labeled "Accum" and "Accumb" because the secondary latch can serve as an accumulator while being used to perform a logical operation. In a number of embodiments, an accumulator comprises the cross coupled transistors 308-1, 308-2, 309-1, and 309-2 forming the secondary latch as well as the pass transistors 307-1 and 308-2. As described further herein, in a number of embodiments, a compute component comprising an accumulator coupled to a sense amplifier can be configured to perform a logical operation that comprises performing an accumulate operation on a data value represented by a signal (e.g., voltage or current) on at least one of a pair of complementary sense lines.

The compute component 333 also includes inverting transistors 314-1 and 314-2 having a first source/drain region coupled to the respective digit lines D and D_. A second source/drain region of the transistors 314-1 and 314-2 is coupled to a first source/drain region of transistors 316-1 and 316-2, respectively. The gates of transistors 314-1 and 314-2 are coupled to a signal 313 (InvD). The gate of transistor 316-1 is coupled to the common node 317-1 to which the gate of transistor 308-2, the gate of transistor 309-2, and the first source/drain region of transistor 308-1 are also coupled. In a complementary fashion, the gate of transistor 316-2 is coupled to the common node 317-2 to which the gate of transistor 308-1, the gate of transistor 309-1, and the first source/drain region of transistor 308-2 are also coupled. As such, enabling signal InvD serves to invert the data value stored in the secondary latch and drives the inverted value onto sense lines 305-1 and 305-2.

In FIG. 3, the compute component 333 is configured to perform an AND, NAND, and/or a NOT (e.g., invert) operation. The following example will demonstrate how a 3-input NAND operation can be performed using data stored in array 330 (e.g., data associated with address space 331 and address space 332) as the inputs, and how the result of the NAND operation can be stored in the array via operation of the sensing circuitry (e.g., sense amplifier 306 and compute component 333). The example involves using the data values (e.g., logic 1 or logic 0) stored in the memory cells 370 coupled to select lines 304-0 to 304-N and commonly coupled to sense line 305-1 as the respective inputs of a NAND operation. The result of the NAND operation can be stored in memory cells of at least one of select lines 304-0 to 304-N.

As an example, the memory cells of row 304-1 (e.g., cell 370-1) can be used as a register for compute component 333. For instance, the compute component 333 can use data stored in a row of address space 331 as input, and an intermediate result of a compute function can be saved in a row of address space 332. In this example, a result of the compute operation can be stored back to a row of address space 331 and/or to a row of address space 332. In a number of embodiments, the result of a compute function can be simultaneously stored to one or more rows of address space 332 and to a row of address space 331.

Using the memory cells of address space 332 for temporary storage can prevent the need to use the memory cells of address space 331 for temporary storage, which can increase the amount of accessible memory. For example, if a compute component 333 uses memory cells of address space 331 as temporary storage, then those cells of address space 331 are unavailable for storing other data, which may inhibit use of the address space 331 (e.g., by a host). For instance, using the address space 331 as temporary storage can limit a total amount of address space available to a host. In contrast, using address space 332 as temporary storage, in association with embodiments described herein, allows the compute component 333 to perform a number of logical operations without limiting a host's ability to use address space 331, for instance.

An example of a logical operation in which address space 332 can be used as registers is described below. For instance, a first operation phase of the 3-input NAND operation can include performing a sensing operation on the memory cells of Row0 (e.g., cell 370-0) using sense amplifier 306 to determine a stored data value, which can serve as a first input of the NAND operation. The sensing operation involves activating Row0 (e.g., via address circuitry 342) and results in a voltage (e.g., Vcc) corresponding to a logic 1 or a voltage (e.g., ground) corresponding to a logic 0 being on sense line D (and the other voltage being on complementary sense line DJ, such that the sensed data value is stored in the primary latch corresponding to sense amplifier 306. After the Row0 memory cell 370-0 is sensed, the Passd and Passdb signals 311-1/311-2 are enabled and the Accumb and Accum signals 312-1/312-2 are enabled, which results in the sensed data value stored in the Row0 memory cell 370-0 being copied to the secondary latch corresponding to compute component 333. The Passd and Passdb signals are then disabled; however, the Accum and Accumb signals remain enabled (during the second, third, and fourth operation phase as described below). Row0 is then disabled and equilibration occurs. Equilibration can involve shorting the complementary sense lines D and D_ together at an equilibration voltage, which can be Vcc/2, for instance. Equilibration can occur, for instance, prior to a memory cell sensing operation.

A second phase of the 3-input NAND operation includes performing a sensing operation on the Row1 memory cell (e.g., 370-1) using sense amplifier 306 to determine its stored data value, which serves as a second input of the NAND operation. As such, Row1 is enabled by address circuitry 342 and the sense lines D and D_ are each driven to a different one of Vcc and ground. In this example, a Vcc voltage on sense line D corresponds to a logic 1 stored in the memory cell 370-1 and a ground voltage on sense line D corresponds to a logic 0; however, embodiments are not limited to this example. After the Row1 memory cell 370-1 is sensed, the Passd signal 311-1 is enabled while the Passdb signal 311-2 remains disabled (e.g., only Passd is enabled). Recall that the Accumb and Accum signals 312-1/312-2 remain enabled. If the data value stored in the Row1 memory cell 370-1 is a logic 0, then the accumulated value associated with the secondary latch is asserted low such that the secondary latch stores logic 0. If the data value stored in the Row1 memory cell 370-1 is not a logic 0, then the secondary latch retains its stored Row0 data value (e.g., a logic 1 or a logic 0). As such, in this example, the secondary latch is serving as a zeroes (0s) accumulator. The Passd signal is then disabled, Row1 is disabled, and equilibration occurs.

A third phase of the 3-input NAND operation includes performing a sensing operation on the Row2 memory cell (e.g., 370-2) using sense amplifier 306 to determine its stored data value, which serves as a third input of the NAND operation. As such, Row2 is enabled by row decoder 346 and the sense lines D and D_ are each driven to a different one of Vcc and ground. After the Row2 memory cell 370-2 is sensed, the Passd signal 311-1 is enabled while the Passdb signal 311-2 remains disabled (e.g., only Passd is enabled). Recall that the Accumb and Accum signals 312-1/312-2 remain enabled. If the data value stored in the Row2 memory cell 370-2 is a logic 0, then the accumulated value associated with the secondary latch is asserted low such that the secondary latch stores logic 0. If the data value stored in the Row2 memory cell 370-2 is not a logic 0, then the secondary latch retains its previously stored value (e.g., its stored value). As such, the value stored in the secondary latch (e.g., the output of the accumulator) is the AND of the data values stored in the respective Row0 memory cell 370-0, Row1 memory cell 370-1, and Row2 memory cells 370-2. The Passd signal is then disabled, Row2 is disabled, and equilibration occurs.

The fourth phase of the 3-input NAND operation includes disabling equilibration such that sense lines D and D_ are floating. The InvD signal 313 is then enabled, which results in an inverting of the data value stored the secondary latch (e.g., inverting the accumulated output). As such, if any of the memory cells 370-0, 370-1, and 370-2 stored a logic 0 (e.g., if any of the three inputs of the NAND operation were logic 0), then the sense line D_ will carry a voltage corresponding to logic 0 (e.g., ground voltage) and sense line D will carry a voltage corresponding to logic 1 (e.g., Vcc). If all of the memory cells 370-0, 370-1, and 370-2 stored a logic 1 (e.g., all of the three inputs of the NAND operation were logic 1), then the sense line D_ will carry a voltage corresponding to logic 1 and sense line D will carry a voltage corresponding to logic 0. The primary latch of sense amplifier 306 is then enabled and the sense line D now contains the NANDed result of the respective input data values from the Row0 to Row2 memory cells 370-0, 370-1, and 370-2. As such, sense line D will be at Vcc if any of the Row0 to Row 2 memory cells stored a logic 0 and sense line D will be at ground if all of the Row0 to Row2 memory cells stored a logic 1. The result of the NAND operation can then be stored back to a memory cell that is associated with the address space 332. In a number of examples, the results of the NAND operation can be stored back to a memory cell that is associated with the address space 331 (e.g., an address space decoded via shared address lines). In this example, the result of the NAND operation can be stored to the Row1 memory cell 370-1. Storing the result of the NAND operation to the Row1 memory cell 370-1 involves activating Row1 via address circuitry 342. The capacitor 303 of the Row1 memory cell 370-1 will be driven to a voltage corresponding to the data value on the sense line D (e.g., logic 1 or logic 0), which essentially overwrites whatever data value was previously stored in the Row1 memory cell 370-1. Saving the results of the logical operation (e.g., NAND) into a register can be helpful, for instance, when the results of the logical operation are intermediate results associated with a more complex operation. For example, the results that are saved in the Row1 memory cell 370-1 can be used as input in a subsequent logical operation. Embodiments are not so limited.

In a number of embodiments, the result of a logical operation may be written to a memory cell that is associated with the address space 331. For example, the result can be stored back to the memory cells of rows 204-2 to 204-N. In a number of embodiments, the result of the logical operation may not be stored back to the array (e.g., either to cells of address space 331 or address space 332). For instance, after performing the logical operation, the result may be transferred from an accumulator (e.g., the accumulator of compute component 333) to an external device (e.g., an external host via local I/O lines coupled to the sense amp).

Also, one of ordinary skill in the art will appreciate that the ability to perform NAND logical operations can enable performance of more complex computing functions such as addition, subtraction, and multiplication, among other primary math functions and/or pattern compare functions. For example, a series of NAND operations can be combined to perform a full adder function. As an example, if a full adder requires 12 NAND gates to add two data values along with a carry in and carry out, a total of 384 NAND operations (12× 32) could be performed to add two 32 bit numbers. Embodiments of the present disclosure can also be used to perform logical operations that may be non-boolean (e.g., copy, compare, etc.) and/or may be more or less complex than a NAND operation.

In a number of examples, a data value that is stored in a memory cell corresponding to a row of address space 331 can be copied to a memory cell corresponding to a row of the address space 332. For example, copying the data value stored in memory cell 370-3 to a memory cell 370-1 can include copying the data value from the memory cell 370-3 to the sense amplifier 306. The data value can then be copied from the sense amplifier 306 to the memory cell 370-1 by activating the select line 204-1.

Copying a data value from the sense amplifier 306 to the memory cell 370-1 can be performed without activating an I/O circuitry. Copying data values from the sense amplifier 306 to a memory cell without activating the I/O circuitry can save time and resources because the I/O circuitry is not activated and because the copying can be performed faster than if the I/O circuitry was activated.

As another example, a data value can be copied from the memory cell 370-3 of the address space 331 to memory cells 370-0 and 370-1 of address space 332 simultaneously. For example, the data value can be copied from the memory cell 370-3 to the sense amplifier 306 and from the sense amplifier 306 to memory cell 370-0 and memory cell 370-1 at the same time. The address circuitry 342 can activate memory cells 370-0 and 370-1 at the same time because the memory cells associated with the address space 332 are discreetly addressed. In contrast, since the rows corresponding to address space 331 are decoded via shared address lines, it may be possible to copy data from sense amp 306 to only one of rows 304-2 to 304-N at a time.

In a number of embodiments, a data value can be copied from a row of address space 331 to a different row of address space 331 and to a row of address space 332. For example a data value can be copied from memory cell 370-3 to the sense amplifier 306 and from the sense amplifier 306 to memory cells 370-1 and 370-2 simultaneously. The data can be copied from the memory cell 370-3 to memory cells 370-1 and 370-2 simultaneously because the address associated with the memory cell 370-2 is decoded by row decoder 346 (e.g., via pre-decoding) and because the address associated with memory cell 370-1 is discreetly addressed. That is, the row decoder 346 can activate the select line 304-2 at a same time as address circuitry 342 can activate select line 304-1.

In a number of embodiments, a data value can be copied from a row of address space 332 to a row of address space 331.

For example, a data value can be copied from memory cell memory cell 370-1 to the sense amplifier 306 and from the sense amplifier 306 to memory cell 370-3. As another example, a data value can be copied from a row of address space 332 to a number of rows of address space 332. For example, the data value can be copied from the memory cell 370-0 to the sense amplifier 306 and from the sense amplifier 306 to at least two different memory cells that are associated with address space 332. In a number of examples, a data value can be copied from a row of address space 332 to the same row of address space 332 and/or a number of different rows of address space 332. A data value can be copied from a row of address 332 to a different row of address space 332 and a row of address space 331 simultaneously.

In a number of embodiments, the above described copying can be performed in a single sensing cycle (e.g., without requiring additional array equilibration, row activation, and/or re-sensing of bit lines). For example, copying a data value from a row of address space 331 to a row of address space 332 within a single sensing cycle can include sensing the row of address space 331. The copying can be performed without requiring additional sensing of the row of address space 331 and without requiring additional equilibration than is performed in the sensing of the data value from the row of address space 331. Furthermore, the copying can be performed without requiring additional row accesses. For example, the data value sensed from a row of address space 331 can be copied to one or more rows of address space 332 by activating (e.g., firing) the select rows of address space 332, but without re-sensing the bit lines corresponding to the selected cells. Having the ability to copy a data value from a row of address space 331 to a number of rows of address space 332, copy a data value from a row of address space 332 to a row of address space 331, and/or copy a data value an address of address space 332 to a number of addresses of address space 332 within a single sensing cycle can provide a significant performance advantage over previous approaches by reducing number of sensing cycles needed to perform the copying.

Embodiments of the present disclosure are not limited to the particular sensing circuitry configuration illustrated in FIG. 3. For instance, different compute component circuitry can be used to perform logical operations in accordance with a number of embodiments described herein. Although not illustrated in FIG. 3, in a number of embodiments, control circuitry can be coupled to array 330, sense amplifier 306, and/or compute component 333. Such control circuitry may be implemented on a same chip as the array and sensing circuitry and/or on an external processing resource such as an external processor, for instance, and can control enabling/disabling various signals corresponding to the array and sensing circuitry in order to perform logical operations as described herein.

CONCLUSION

The present disclosure includes devices and methods for accessing a memory array address space. An example memory array comprising a first address space comprising memory cells coupled to a first number of select lines and to a number of sense lines and a second address space comprising memory cells coupled to a second number of select lines and to the number of sense lines. The first number of select lines are decoded via a number of shared select lines. The first address space is independently addressable relative to the second address space.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A memory array, comprising:
   a first address space comprising memory cells coupled to a first number of select lines and to a number of sense lines; and
   a second address space comprising memory cells coupled to a second number of select lines and to the number of sense lines;
   wherein the first address space is independently addressable relative to the second address space; and
   wherein the first number of select lines are coupled to a decoder and the second number of select lines are not coupled to the decoder and are coupled directly to an address circuitry.

2. The memory array of claim 1, wherein only one of the first number of select lines is activated at a given time and wherein the second number of select lines are activated simultaneously.

3. The memory array of claim 2, wherein a select line of the first number of select lines and a select line of the second number of select lines are activated simultaneously.

4. The memory array of claim 1, wherein a select line of the first number of select lines and a select line of the second number of select lines are activated simultaneously.

5. The memory array of claim 4, wherein the select line of the first number of select lines and all of the second number of select lines are activated simultaneously.

6. The memory array of claim 4, wherein only one of the first number of select lines is activated at a given time.

7. The memory array of claim 1, wherein the first address space being independently addressable relative to the second address space comprises the first number of select lines being coupled to the decoder and the second number of select lines being coupled directly to address circuitry.

8. The memory array of claim 7, wherein the address circuitry is coupled to the decoder.

9. The memory array of claim 1, wherein the first address space being independently addressable relative to the second address space comprises the first number of select lines being coupled to a number of shared address lines via the decoder and the second number of select lines being discreetly addressable.

10. The memory array of claim 1, wherein each of the second number of select lines are individually addressed.

11. The memory array of claim 1, wherein the memory cells that comprise the first address space are coupled to the memory cells that comprise the second address space through the number of sense lines.

12. The memory array of claim 1, wherein the first number of select lines are decoded independently of the second number of select lines.

13. The memory array of claim 1, wherein the memory cells that comprise the second address space are on an edge portion of the memory array.

14. The memory array of claim 1, wherein the second address space is used as temporary storage for a compute component.

15. The memory array of claim 14, wherein the temporary storage is used as a register by the compute component.

16. The memory array of claim 14, wherein the compute component is coupled to the number of sense lines and comprises transistors formed on pitch with the memory cells.

17. A method comprising:
activating a select line of a first number of select lines of a memory array;
sensing, via sensing circuitry coupled to sense lines of the memory array, data stored in a first number of memory cells coupled to the select line; and
copying the data stored in the first number of memory cells coupled to the select line of the first number of select lines to a second number of memory cells coupled to a select line of a second number of select lines of the memory array;
wherein the first number of select lines are independently addressable relative to the second number of select lines; and
wherein the first number of select lines are coupled to a decoder and the second number of select lines are not coupled to the decoder and are coupled directly to an address circuitry.

18. The method of claim 17, wherein copying the data stored in the first number of memory cells includes copying the data from the sensing circuitry to the second number of memory cells without accessing an input/output (I/O) line.

19. The method of claim 18, wherein copying the data from the sensing circuitry to the second number of memory cells further includes copying the data from the sensing circuitry to a third number of memory cells coupled to another select line of the first number of select lines.

20. The method of claim 19, wherein copying the data from the sensing circuitry to the second number of memory cells and copying the data from the sensing circuitry to the third number of memory cells occurs simultaneously.

21. The method of claim 17, wherein activating the select line of the first number of select lines includes activating the select line via decode circuitry that is independent of decode circuitry associated with activating the select line of the second number of select lines.

22. A method comprising:
activating a select line of a first number of select lines of a memory array, wherein memory cells coupled to the first number of select lines are used as temporary storage by a compute component;
sensing, via sensing circuitry coupled to sense lines of the memory array, data stored in a first number of memory cells coupled to the select line of the first number of select lines; and
copying the data stored in the first number of memory cells to a second number of memory cells coupled to a select line of a second number of select lines of the memory array;
wherein the first number of select lines are independently addressable relative to the second number of select lines; and
wherein the first number of select lines are coupled to a decoder and the second number of select lines are not coupled to the decoder and are coupled directly to an address circuitry.

23. The method of claim 22, wherein copying the data stored in the first number of memory cells includes copying the data from the first number of memory cells that are used as temporary storage to the sensing circuitry.

24. The method of claim 23, wherein copying the data stored in the first number of memory cells includes copying the data from the sensing circuitry to the second number of memory cells without accessing an input/output (I/O) line.

25. The method of claim 23, wherein copying the data stored in the first number of memory cells includes copying the data from the sensing circuitry to a third number of memory cells coupled to another select line of the first number of select lines.

26. The method of claim 23, wherein copying the data stored in the first number of memory cells includes copying the data from the sensing circuitry to a third number of memory cells coupled to another select line of the first number of select lines and the first number of memory cells coupled to the select line of the first umber of select lines simultaneously.

27. The method of claim 22, wherein copying the data stored in the first number of memory cells includes copying within a single sensing cycle.

* * * * *